(12) United States Patent
Koga et al.

(10) Patent No.: US 11,764,138 B2
(45) Date of Patent: *Sep. 19, 2023

(54) GLASS CORE DEVICE AND METHOD OF PRODUCING THE SAME

(71) Applicant: TOPPAN PRINTING CO., LTD., Tokyo (JP)

(72) Inventors: Osamu Koga, Tokyo (JP); Yasuyuki Hitsuoka, Tokyo (JP); Yoshito Akutagawa, Tokyo (JP)

(73) Assignee: TOPPAN PRINTING CO., LTD., Tokyo (JP)

(*) Notice: Subject to any disclaimer, the term of this patent is extended or adjusted under 35 U.S.C. 154(b) by 105 days.

This patent is subject to a terminal disclaimer.

(21) Appl. No.: 16/938,144

(22) Filed: Jul. 24, 2020

(65) Prior Publication Data

US 2020/0357734 A1    Nov. 12, 2020

Related U.S. Application Data

(63) Continuation of application No. PCT/JP2019/001590, filed on Jan. 21, 2019.

(30) Foreign Application Priority Data

Jan. 30, 2018  (JP) ................................ 2018-013620

(51) Int. Cl.
  *H01L 21/768*  (2006.01)
  *H01L 23/522*  (2006.01)
  (Continued)

(52) U.S. Cl.
  CPC ...... *H01L 23/49827* (2013.01); *H01L 21/486* (2013.01); *H01L 21/76802* (2013.01); *H01L 23/15* (2013.01)

(58) Field of Classification Search
  CPC ............ H01L 23/49827; H01L 21/486; H01L 21/76802; H01L 23/15; H01L 23/49816;
  (Continued)

(56) References Cited

U.S. PATENT DOCUMENTS 6,127,633 A * 10/2000 Kinoshita .............. H05K 3/421
    174/255
6,492,600 B1 * 12/2002 Jimarez .................. H05K 1/112
    174/262
(Continued)

FOREIGN PATENT DOCUMENTS

JP    2007-318058 A    12/2007
JP    2015-513820 A    5/2015
(Continued)

OTHER PUBLICATIONS

International Searching Authority, "International Search Report," issued in connection with International Patent Application No. PCT/JP2019/001590, dated Apr. 2, 2019.
(Continued)

*Primary Examiner* — Marcos D. Pizarro
*Assistant Examiner* — Tenley H Schofield
(74) *Attorney, Agent, or Firm* — Foley & Lardner LLP

(57) ABSTRACT

A glass core device with a wiring pattern on a first surface of a glass core and a wiring pattern on a second surface thereof being electrically connected via a wiring pattern embedded in TGVs formed in the glass core. In a state of being cut out by dicing, each glass core has a second surface and side faces which are continuously covered with an outer protective layer.

7 Claims, 8 Drawing Sheets

(51) Int. Cl.
*H01L 23/00* (2006.01)
*H01L 23/31* (2006.01)
*H01L 23/495* (2006.01)
*H01L 23/528* (2006.01)
*H01L 23/532* (2006.01)
*H01L 23/498* (2006.01)
*H01L 21/48* (2006.01)
*H01L 23/15* (2006.01)

(58) Field of Classification Search
CPC . H01L 2924/15192; H01L 2924/15788; H01L 2924/00014; H01L 2224/73204; H01L 25/0655; H05K 3/0052; H05K 2201/0909; H05K 1/0306
See application file for complete search history.

(56) References Cited

U.S. PATENT DOCUMENTS

| | | | |
|---|---|---|---|
| 9,425,761 B2* | 8/2016 | Zuo | H03H 7/0138 |
| 2003/0160303 A1* | 8/2003 | Hirokawa | H01L 21/76838 |
| | | | 257/620 |
| 2006/0141750 A1* | 6/2006 | Suzuki | H01L 21/78 |
| | | | 438/460 |
| 2008/0238599 A1* | 10/2008 | Hebert | H01L 23/645 |
| | | | 336/232 |
| 2009/0013724 A1 | 1/2009 | Koyo et al. | |
| 2010/0108361 A1* | 5/2010 | Sakaguchi | H05K 3/0052 |
| | | | 174/251 |
| 2013/0050228 A1 | 2/2013 | Petersen et al. | |
| 2013/0207745 A1 | 8/2013 | Yun et al. | |
| 2013/0228918 A1* | 9/2013 | Chen | H01L 23/5384 |
| | | | 257/737 |
| 2014/0015121 A1 | 1/2014 | Koizumi et al. | |
| 2015/0129293 A1* | 5/2015 | Cho | H01L 24/97 |
| | | | 174/258 |
| 2015/0319852 A1* | 11/2015 | Min | H05K 1/115 |
| | | | 361/784 |
| 2016/0135289 A1 | 5/2016 | Cho et al. | |
| 2016/0192490 A1* | 6/2016 | Kang | H05K 3/0023 |
| | | | 29/853 |
| 2016/0268206 A1* | 9/2016 | Hu | H01L 23/481 |
| 2017/0221837 A1* | 8/2017 | Hedrick | H01L 21/486 |
| 2018/0005922 A1* | 1/2018 | Levesque, Jr. | H01L 21/268 |
| 2018/0026666 A1* | 1/2018 | Yun | H05K 1/165 |
| | | | 455/188.1 |

FOREIGN PATENT DOCUMENTS

JP 2017-143140 A 8/2017
KR 20160016095 A 2/2016

OTHER PUBLICATIONS

International Searching Authority, "Written Opinion," issued in connection with International Patent Application No. PCT/JP2019/001590, dated Apr. 2, 2019.
Extended European Search Report dated Feb. 15, 2021 for corresponding European Patent Application No. 19747585.8.
Office Action issued in corresponding European Patent Application No. 19747585.8, dated Dec. 22, 2022.

* cited by examiner

GLASS CORE DEVICE AND METHOD OF PRODUCING THE SAME

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2019/001590, filed on Jan. 21, 2019, which is based upon and claims the benefit of priority to Japanese Patent Application No. 2018-013620, filed on Jan. 30, 2018, the disclosures of which are all incorporated herein by reference in their entireties.

BACKGROUND

Technical Field

The present invention relates to a glass core device and a method of producing the same.

Background Art

Recently, there is an increasing demand for miniaturization, power saving and high performance in electronics represented by smartphones or the like. With this demand, semiconductor packages or electronic devices incorporating passive components, such as capacitors, inductors and resistors, are also desired to be miniaturized or save power even more, while maintaining high performance. To enhance appeal to the consumers of electronics, the cost of electronics is desired to be reduced.

As measures to enhance miniaturization or low power consumption, a multilayer wiring pattern processing method is under development. In this method, interlayer connection is established using through-silicon vias (termed TSVs hereinafter) that use a silicon material as a core, or through-glass vias (termed TGVs hereinafter) that use a glass material as a core. However, forming TSVs in a silicon material as a core generally involves high cost of materials and high manufacturing cost and therefore reducing the cost is difficult. In this regard, glass cores are expected to solve the issues of cost due to possible mass production using a relatively cheap core material and production from large square panels.

CITATION LIST

Patent Literature

Patent Literature 1 JP 2015-513820 A

SUMMARY OF THE INVENTION

Technical Problem

Patent Literature 1 discloses a processing method in which wiring patterns are spirally formed in TSVs and on both surfaces of a glass core to form an inductor for an LC bandpass filter that is a passive component. In this example of conventional art, a glass core is used as a core of an inductor. There is also disclosed a processing method in which an inductor is sandwiched between wiring patterns formed on a glass core to form a capacitor.

However, many issues have to be solved to actually form TGVs in a glass core. For example, through holes have to be formed in the glass core to form TGVs. The method of forming the through holes may be a physical processing method using a drill or a blasting machine, an etching method using a reactive gas or hydrofluoric acid, or a laser irradiation method.

However, glass cores are made of an amorphous material which has relatively low elasticity and easily cracks when tensile stress is applied thereto. Therefore, for example, when physically processed by using a drill or a blasting machine, glass cores may be broken starting from microcracks caused by this physical processing.

Furthermore, since glass has a slow decomposition rate, glass cores, when dry-etched with a fluorine-based reactive gas, require a long processing time for forming through holes. Also, when glass cores are wet-etched with hydrofluoric acid, reaction proceeds isotropically. Therefore, wet etching cannot be used for forming micro-diameter through holes in glass cores. In this regard, processing methods using irradiation of a high-energy laser beam, such as YAG laser or $CO_2$ laser, achieve relatively high processing speed among the processing methods mentioned above, and thus can be used for forming micro-diameter through holes in glass cores, i.e., are suitable for forming TGVs.

However, processing speed and processing quality are in a trade-off relationship. Specifically, for example, when through holes are formed in a glass core using a high-energy laser to increase processing speed, the glass material may melt and scatter on the surfaces of the glass core due to heating caused by the laser beam irradiation, or otherwise, the glass material may be deposited around the through holes like ridges, forming nodules (asperities) and impairing flatness on the surfaces of the glass core. Impairment of flatness on the surfaces of a glass core may hinder formation of micro-wiring patterns on these surfaces. Furthermore, forcible formation of wiring patterns on the asperities may concentrate stress on the wiring patterns and this may cause disconnection.

After filling the TGVs with an electrically conductive metal material, the excess electrically conductive metal material on the surface of the glass core may be removed by chemical mechanical polishing (CMP) or grinding with a diamond whetstone. In this case, the weak amorphous portions on the surface of the glass core may also be polished or ground together, causing microcracks on the surface of the glass core. In addition, chemical treatment with strong acid or strong alkali may also cause microcracks mentioned above and may cause breakage of the glass substrate starting from these microcracks.

The present invention has been made to solve these issues and aims to provide a glass core device having higher reliability by protecting the surfaces of a glass core in which TGVs are formed.

The present invention also aims to provide a method of producing a glass core device having sufficient mechanical strength by flattening and protecting the surfaces of a glass core in which TGVs are formed.

Solution to Problem

A glass core device of the present invention includes a flat glass core having a first surface and a second surface facing away from each other, through-glass vias formed in the glass core, and a wiring pattern embedded in the through-glass vias, the first surface and the second surface of the glass core being respectively provided thereon with wiring patterns which are electrically connected via the wiring pattern embedded in the through-glass vias. The glass core device is characterized in that the glass core device is provided with a protective resin covering the first surface of the glass core and the second surface of the glass core.

A method of producing a glass core device of the present invention is characterized in that the method includes steps of: forming through holes in a glass core having a first surface and a second surface facing away from each other; forming through-glass vias by forming a wiring pattern on the first surface of the glass core and in the through holes thereof, and sealing the first surface with an insulating resin; bonding a carrier substrate onto the first surface of the glass core; linearly irradiating the second surface of the glass core with a laser beam to transform the glass core; etching away the transformed portions of the glass core by chemical treatment to form grooves for dicing the glass core; forming a wiring pattern on the second surface of the glass core, filling the grooves with a protective resin, and sealing the second surface with the protective resin; and cutting the protective resin filled in the grooves.

Advantageous Effects of the Invention

The present invention can provide a glass core device having higher reliability by protecting the surfaces of a glass core in which TGVs are formed.

The present invention can provide a method of producing a glass core device having sufficient mechanical strength by flattening and protecting the surfaces of a glass core in which TGVs are formed.

DETAILED DESCRIPTION

Figure 1:
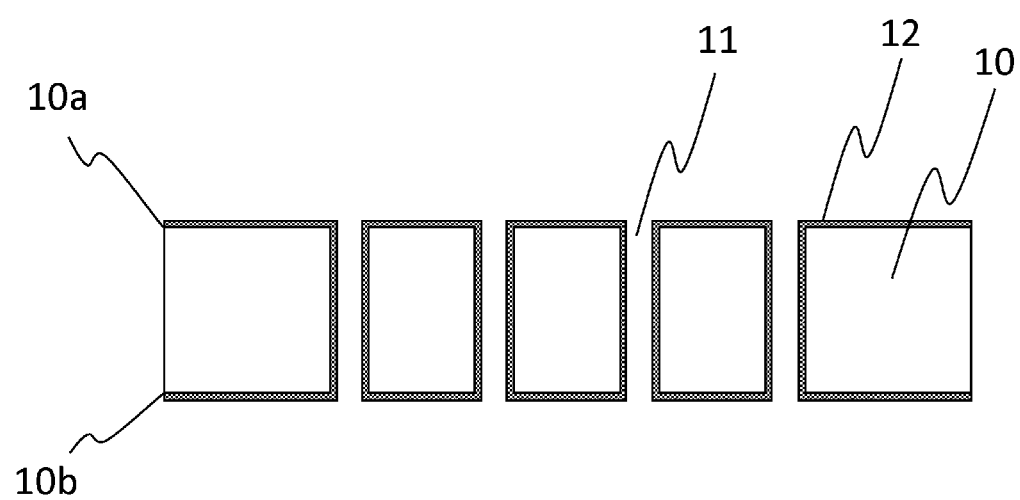
FIG. 1 is a cross-sectional view illustrating a state in which a seed layer has been formed on a glass core in which TGVs are formed.

With reference to the accompanying Figures, a description will now be given of representative embodiments according to the present invention. The present invention is not limited to the following representative embodiments, and appropriate modifications can be made without departing from the spirit of the present invention. The representative embodiments described below are merely examples of the present invention, and the design thereof could be appropriately changed by one skilled in the art. Here, the drawings are schematic, and the relationship between thickness and plane size, the ratio of the thickness of each layer, etc., may be different from actual ones. The embodiments described below are merely examples of the configurations for embodying the technical idea of the present invention, and the technical idea of the present invention should not limit the materials, shapes, structures, and the like of the components to those described below. The technical idea of the present invention can be modified in various ways within the technical scope specified by the claims.

The same constituent elements are denoted by the same reference numerals unless there is a reason for the sake of convenience, and redundant description is omitted. In the drawings referred to in the following description, for clarity, characteristic parts are enlarged, and thus the components are not shown to scale. It is, however, clear that one or more embodiments can be implemented without such details. In addition, known structures and devices may be schematically represented for simplicity.

With reference to the accompanying drawings, some embodiments of the present invention will be described. FIGS. 1 to 7 each show a process of producing a glass core device according to a first embodiment. In the present specification, the term through-glass vias (TGVs) refers to a wiring pattern formed through a glass core; however, herein, the term also refers to through holes prior to forming a wiring pattern.

First Embodiment (Step 1)

First, TGVs 11 are formed in a glass core 10 as shown in FIG. 1. The method of forming TGVs 11 may be laser beam irradiation or chemical treatment using hydrofluoric acid but is not limited thereto. A seed layer 12 for supplying electrical power for electroplating is formed on surfaces of the glass core 10 having a thickness of 300 μm in which TGVs 11 have been formed. The seed layer 12 for supplying electrical power can be formed by Ti/Cu sputtering or electroless copper plating. The seed layer 12 is formed at least on a first surface 10a and inside TGVs 11. When forming the seed layer 12 by Ti/Cu sputtering in TGVs 11 having a small diameter, it is preferred that sputtering is performed from both sides of the glass core 10 because the seed layer 12 can be formed across the inner surface of each TGV.

(Step 2)

Figure 2:
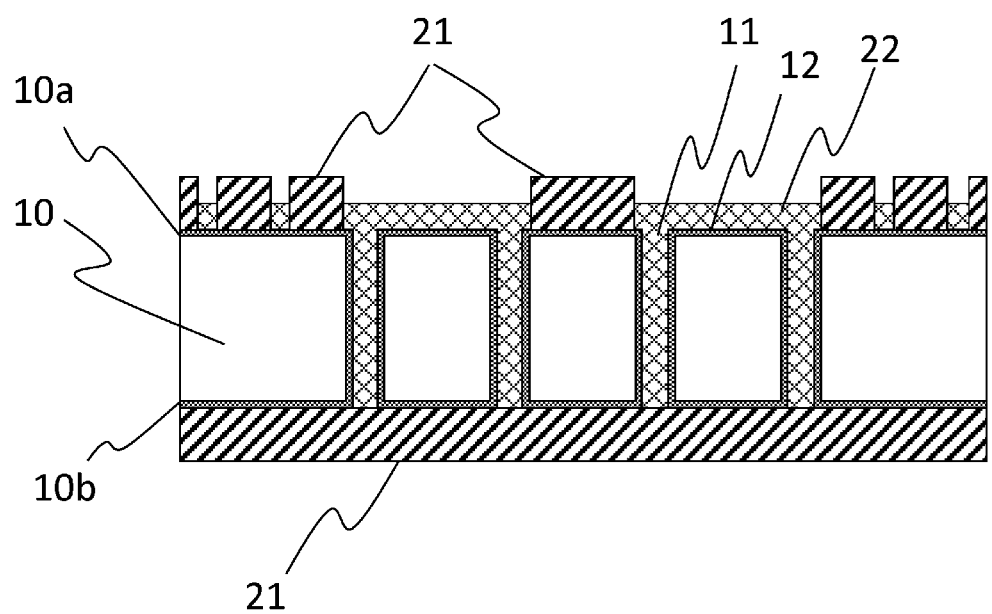
FIG. 2 is a cross-sectional view illustrating a state in which an electrolytic copper plating has been formed in gaps of a dry film resist pattern.

Next, as shown in FIG. 2, a layer of a photoresist 21 of a desired pattern is formed on the first surface 10a and a second surface 10b of the glass core 10. As a material for the photoresist 21, a dry film resist is typically used in many cases. Herein, however, a direct drawing type photoresist RD-1225 (product name) manufactured by Hitachi Chemical Company, Ltd. is laminated on both surfaces of the glass core 10. Subsequently, a desired pattern is drawn on the first surface 10a, followed by development, to expose the seed layer 12 formed in step 1. Electrical power is then supplied to the exposed seed layer to form an electrolytic copper plating 22 with a thickness of 2 μm to 10 μm.

(Step 3)

Figure 3:
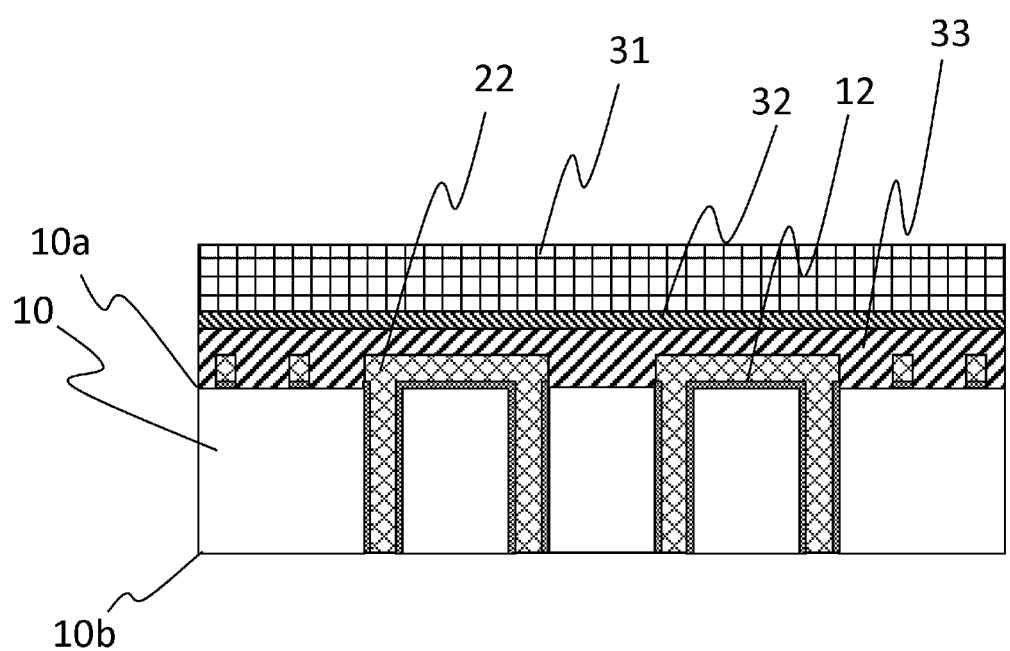
FIG. 3 is a cross-sectional view illustrating a state in which a wiring pattern protective resin has been formed on a first surface of the glass core, with a support substrate being temporarily bonded thereon.

As shown in FIG. 3, unwanted dry film resist is separated and the seed layer 12 is etched away to thereby form a desired copper wiring pattern on the first surface 10a of the glass core 10. Then, a coating of a wiring pattern protective insulating resin 33 is formed on the copper wiring pattern. Furthermore, a carrier substrate 31 is bonded to the first surface 10a of the glass core 10 via an adhesive 32 for temporary bonding.

In the present embodiment, as shown in FIG. 3, the copper wiring pattern is formed as a single layer. However, the copper wiring pattern may be formed as a buildup multilayer wiring pattern by forming vias in the wiring pattern protective insulating resin 33 and further forming a copper wiring pattern thereon. The present embodiment is described taking an example in which an epoxy substrate is separately prepared as a carrier substrate 31. However, the carrier substrate may be a glass substrate or a metal plate, such as SUS, as long as the substrate is rigid and smooth.

(Step 4)

Figure 4:
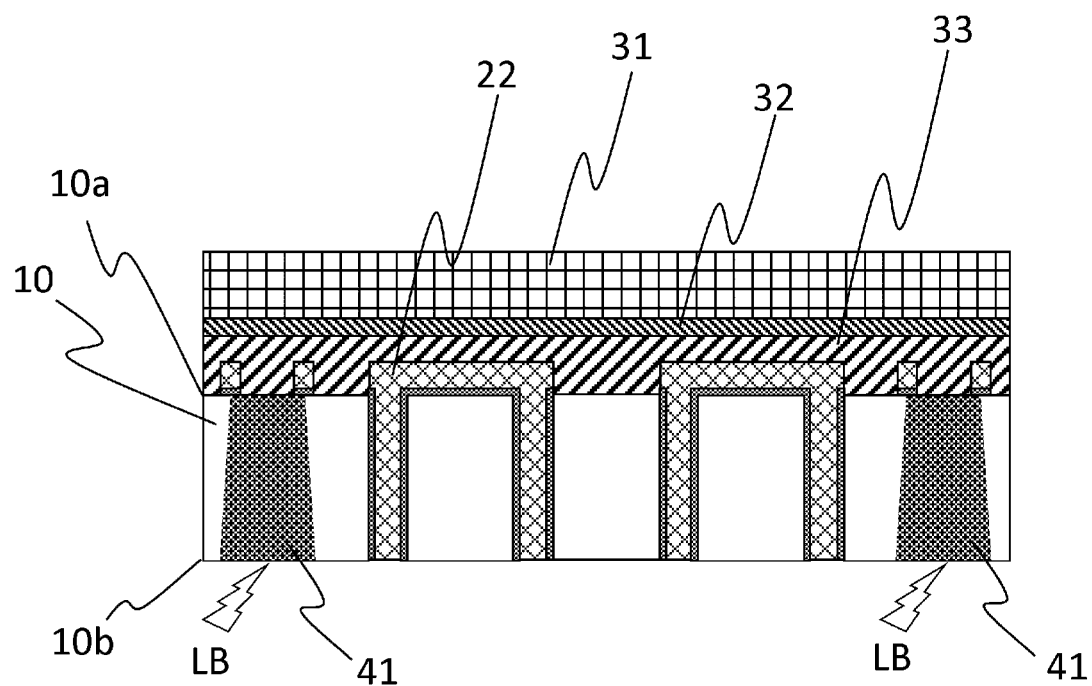
FIG. 4 is a cross-sectional view illustrating a state in which portions of the glass core have been irradiated with a $CO_2$ laser beam from a second surface side thereof and transformed.

As shown in FIG. 4, the glass core 10 is irradiated with a femtosecond laser beam LB in an X-Y matrix so that the irradiated portions are each transformed in a shape of a tapered groove, so that the glass core 10 can be diced to a size required as a glass core device. The glass portions (the portions each transformed in a shape of a tapered groove) 41 irradiated with the femtosecond laser beam LB exhibit improved solubility in a glass-dissolving solution such as of hydrofluoric acid. The femtosecond laser used herein is preferred to have an output of 0.1 µJ or more, and more preferably 0.4 µJ or more. The present embodiment is described taking an example of using a femtosecond laser. However, any laser, e.g., a picosecond laser, may be used as long as it is a pulsed laser.

(Step 5)

Figure 5:
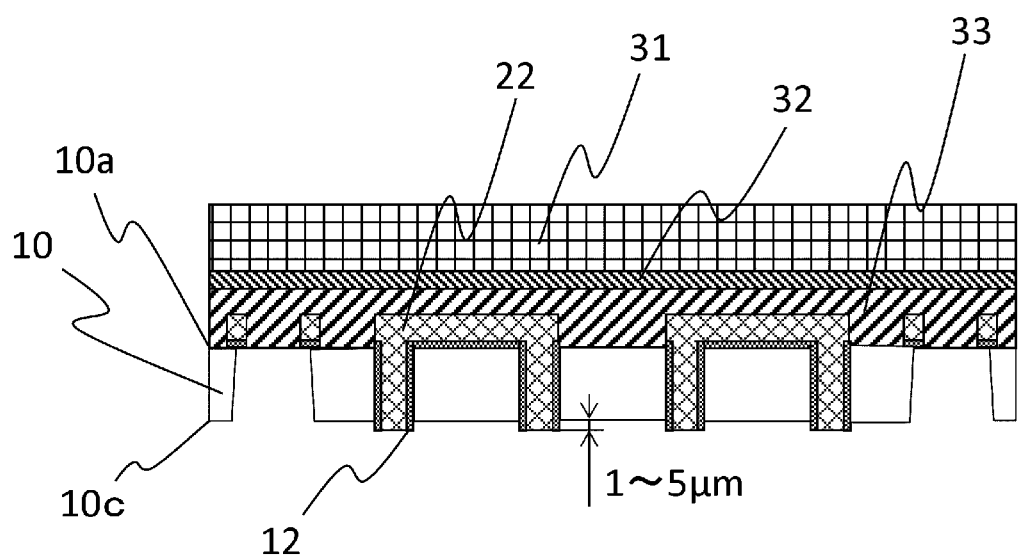
FIG. 5 is a cross-sectional view illustrating a state in which glass has been dissolved from the second surface side of the glass core.

The second surface 10b is flatly ground by 100 µm to 150 µm. Thus, a thin glass core device can be formed. The glass core 10 is then immersed in a glass-dissolving solution such as of hydrofluoric acid, or a glass-dissolving solution is sprayed onto the second surface 10b, to preferentially dissolve the glass portions 41 that have been transformed by the femtosecond laser processing in step 4, while also dissolving the second surface 10b of the glass core even more by 1 µm to 5 µm. As a result, a second surface 10c as shown in FIG. 5 is formed. Thus, ends of the copper wiring pattern embedded in TGVs 11 protrude by 1 µm to 5 µm. In this processing, microcracked portions produced on the femtosecond laser processed surfaces and the ground second surface 10b are dissolved and removed, as an effective side benefit of the glass-dissolving solution, to thereby form the second surface 10c. Therefore, the glass core 10 is prevented from cracking in the subsequent steps.

(Step 6)

Figure 6:
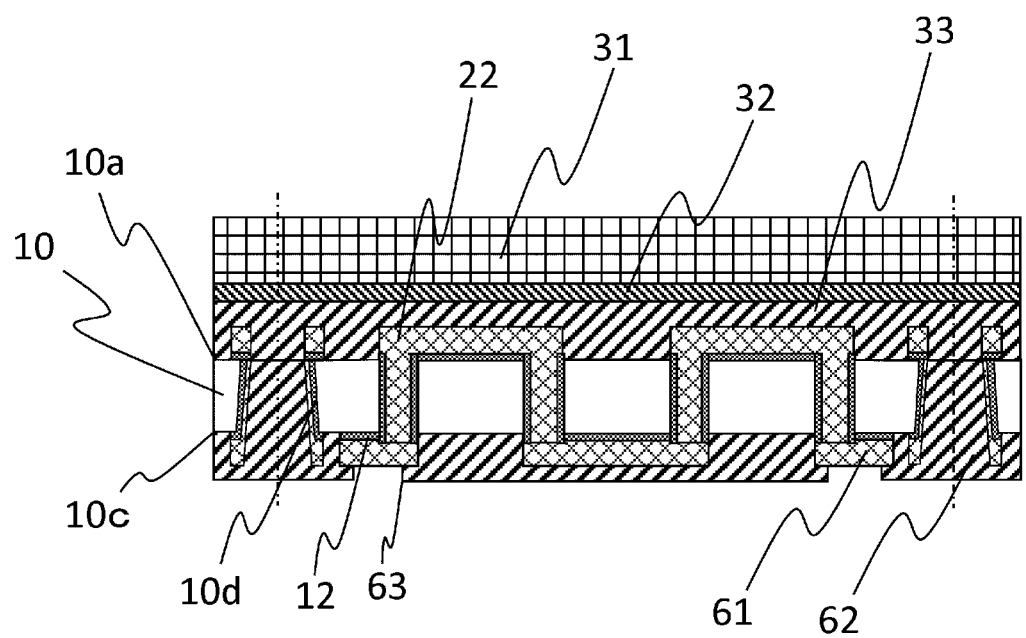
FIG. 6 is a cross-sectional view illustrating a state in which a wiring pattern has been formed on the second surface of the glass core and a wiring pattern protective resin has been further formed thereon.

Next, as shown in FIG. 6, another seed layer 12 for electrical power supply is formed on the second surface 10c of the glass core 10 as in steps 1 and 2. Thereafter, a pattern of a dry film resist (not shown) is formed on the second surface 10c of the glass core 10 to connect between the ends of the copper wiring pattern protruded from the second surface 10c. Furthermore, electrical power is supplied to the seed layer 12 to form an electrolytic copper plating 61 with a thickness of 2 µm to 10 µm and then unwanted dry film resist is separated, followed by etching away the exposed seed layer 12.

The electrolytic copper plating 61 provides a copper plating structure covering the copper wiring pattern exposed from the second surface 10c of the glass core 10. Since the electrolytic copper plating 61 is deposited from the seed layer 12 and the copper wiring pattern which are not flush with the second surface 10c of the glass core 10, the copper cannot separate from the second surface 10c of the glass core 10. Furthermore, the second surface 10c of the glass core 10 is covered with an outer protective layer (protective resin) 62 such as of a solder resist, for protection. If an external connection terminal or the like is required to be connected, an opening 63 may be formed to expose the copper pattern.

(Step 7)

Figure 7:
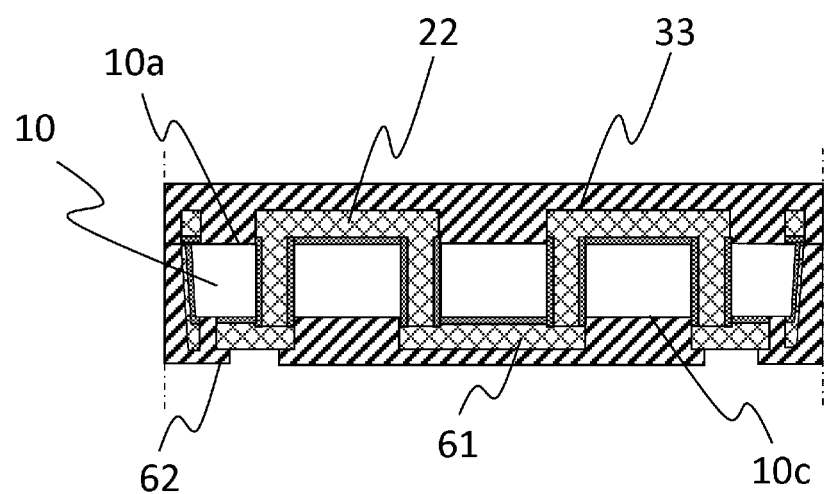
FIG. 7 is a cross-sectional view illustrating a glass core device cut out by dicing the wiring pattern protective resin in a device size and separated from a carrier substrate.

Next, the outer protective layer 62 such as of a solder resist is diced in an X-Y matrix at the positions (at the centers of the respective grooves resulting from transformation by the laser beam) indicated by the dash-dot lines in FIG. 6 to cut out glass core devices. Then, the glass core devices are separated from the carrier substrate 31, to which they have been temporarily bonded in step 3, to complete a glass core device as shown in FIG. 7. In this case, it is preferred that the seed layer 12 and the electrolytic copper plating 61 are ensured to remain on side faces 10d of the glass core 10 shown in FIG. 6. The glass core devices herein have been cut out together with the carrier substrate 31 by dicing. However, the glass core devices alone may be cut out by dicing without cutting the carrier substrate 31. In this case, glass core devices remain adhered to the carrier substrate 31 to improve handleability during transportation or storage.

Second Embodiment

Figure 8:
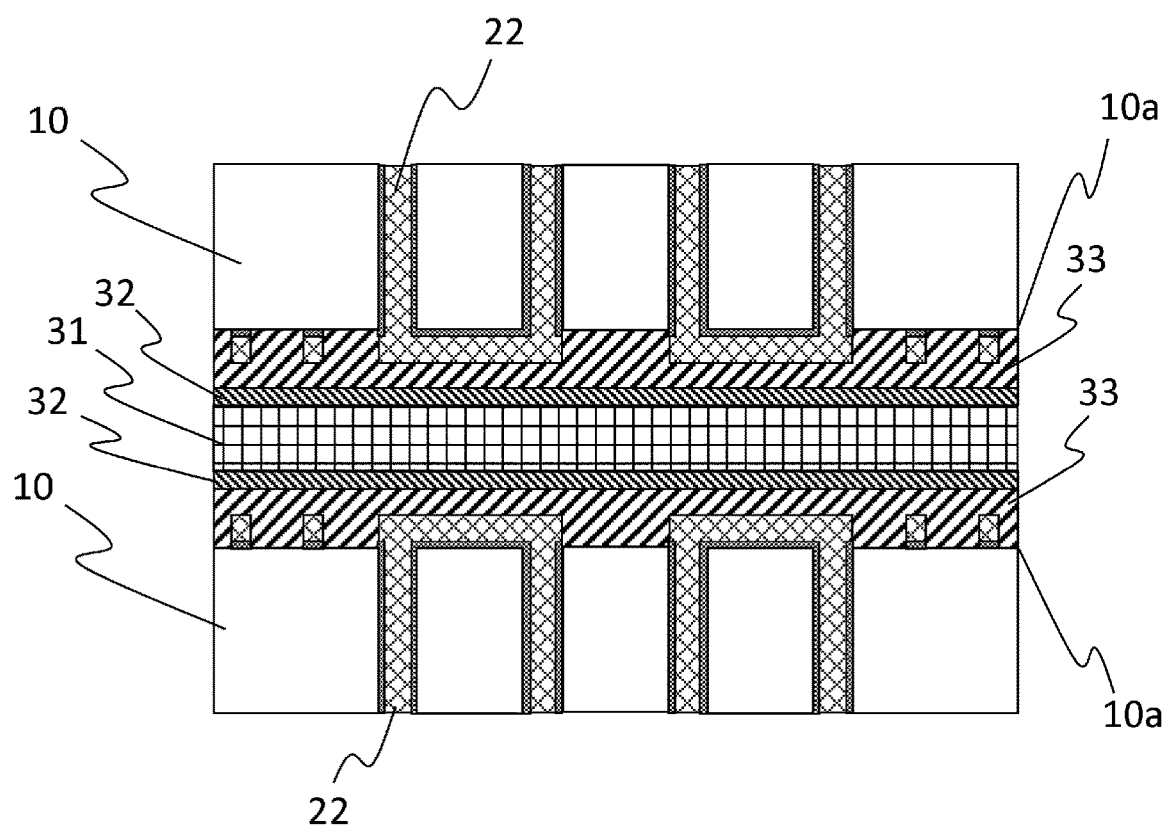
FIG. 8 is a cross-sectional view illustrating two glass cores which are respectively provided with wiring pattern protective resins on the first surfaces thereof and are temporarily bonded together via a carrier substrate so that the first surfaces face each other.

As in the processing of the first embodiment, two intermediate products of the same size are prepared referring to FIG. 2. Then, as shown in FIG. 3, seed layers 12 are etched away to form desired copper wiring patterns on the respective first surfaces 10a of the two glass cores 10, which are then coated with a wiring pattern protective insulating resin 33. Next, in the present embodiment, an adhesive 32 for temporary bonding is applied, as shown in FIG. 8, to both surfaces of a carrier substrate 31. Then, the first surfaces 10a of the two glass cores 10 are bonded to the carrier substrate 31 so as to face each other.

The processing after that is the same as in the embodiment described above.

The first embodiment described above has shown an example of producing a glass core device, in which the number of glass core devices correspond to the number of segments of a carrier substrate 31. However, in the second embodiment, steps 4 to 7 can be performed on both surfaces of one carrier substrate 31. Therefore, glass core devices that have twice the number of segments of the carrier substrate 31 can be prepared, i.e., production efficiency is improved approximately twofold by simple calculations.

In the present embodiment described above, the intermediate products have been bonded together via a carrier substrate 31. However, two intermediate products may be bonded together via only one adhesive layer for temporary bonding, without using a carrier substrate.

The present embodiment can provide a glass core device, at low cost, having reliability and sufficient mechanical strength by flattening and protecting the surfaces of a glass core in which TGVs are formed, and a method of producing the glass core device. Also, in the present embodiment, microcracked portions on the surfaces of a glass core due to polishing/grinding, or due to transportation or rack storage with the glass-core-device-producing equipment, or due to chemical treatment with strong acid or strong alkali, are dissolved and removed in a glass-dissolving solution. Then, a protective resin, such as an insulating liquid resin or a dry film material, is applied to the exposed glass core and the wiring pattern to prevent the glass core from being exposed to the outside. Thus, product quality is improved.

Furthermore, in the present embodiment, a glass material with a thickness of 800 µm or more is thinned, so that the glass core will finally have a preferred thickness of 20 µm or more and 800 µm or less. The glass core with such a thickness can alleviate the stress by gradual annealing, which is applied when forming a copper wiring pattern or an insulating resin layer on the glass core. If the glass core material with the above thickness is used alone, the glass core may crack during the production process. Therefore, it is desired that a carrier substrate is bonded, as in the present embodiment, to the first surface of the glass core via a separable adhesive, and then separated after producing glass core devices.

In the present embodiment, the second surface of the glass core is treated with hydrofluoric acid. This treatment can remove the microcracked portions caused due to grinding for thinning the glass core, or due to transportation contact or rack storage contact, or due to chemical treatment with strong acid or strong alkali, or the like. By undergoing hydrofluoric acid treatment, the glass core can have a surface roughness Ra of 20 nm or less (according to ISO25178-604, and which can be measured by using a NewView 8200 (product name) manufactured by Zygo Corporation), so that the glass core is prevented from being broken starting from the microcracks. It should be noted that the surface roughness Ra of a glass core can be measured when separating the protective resin layer from glass core devices as products.

Furthermore, in the present embodiment, at least the outer peripheral portion of the first surface of the glass core and the side faces of the glass core are covered with a metal film and are further coated with a protective resin. If the glass core is exposed from the glass core device, the glass core may crack due to the thermal shock induced by rapid heating treatment during the process of mounting active and passive components to the glass core device or the process of soldering the device to the motherboard, e.g., a reflow process, or due to mechanical impact caused by the glass core device impacting other objects. In this regard, in the present embodiment, the side faces of the glass core (inside the grooves where the glass has been transformed by laser beam irradiation and removed by hydrofluoric acid) can be easily covered with a metal film formed by a dry film forming method, such as sputtering or deposition, or by a wet film forming method, such as metal plating. Thus, the glass core is prevented from cracking from the side faces thereof. Furthermore, by coating the side faces of the glass core with a protective resin, corrosion of the metal film can be prevented.

Furthermore, in the present embodiment, a hydrofluoric-acid resistant protective film is laminated on the first surface of the glass core and then the second surface thereof is treated with hydrofluoric acid to reduce the thickness of the glass core. At the same time, the glass core can be cut to a desired glass-core-device size. Glass core devices generally have a rectangular parallelopiped shape with a 2 mm- to 50 mm-square bottom. Since the glass core enclosed in a glass core device is processed from the second surface side when reducing the thickness thereof, the glass core may have a truncated square pyramidal shape (i.e., tapered) in which the sides on the first surface are shorter than the sides on the second surface. To improve productivity and reduce cost, the glass core devices of the present embodiment are collectively produced by using a 300 mm-square glass material and arranging the glass core devices in a matrix.

The present embodiment uses a glass core in which a wiring pattern is formed in TGVs and a desired multilayer wiring layer is formed on the first surface. Since glass core materials suffer from an issue of easily cracking during the production process as mentioned above, a carrier substrate is bonded to the first surface of the glass core via a separable adhesive.

Furthermore, the glass core is linearly irradiated with a controlled femtosecond laser beam from the second surface side along division lines conforming to the glass-core-device size to transform portions of the glass core without being melted. Thus, in hydrofluoric acid treatment, the transformed linear portions of the glass core are more preferentially etched away than in the portions not irradiated with the laser beam. While the second surface of the glass core undergoes etching for thickness reduction, the portions transformed by laser beam irradiation are etched away. Thus, the glass core can be cut to a desired size.

Furthermore, in the present embodiment, a hydrofluoric-acid resistant protective film is firstly laminated on the first surface of the glass core and then the second surface thereof undergoes hydrofluoric acid treatment to reduce the thickness of the glass core. Through this treatment, the ends of the copper wiring pattern formed in TGVs are protruded from the second surface of the glass core. This protrusion contributes to improving reliability on the second surface of the glass core when establishing connection with a wiring pattern in the later process. Thus, the hydrofluoric acid treatment is preferred to be performed such that the ends of the wiring pattern in TGVs are exposed at a height of 1 µm to 15 µm from the second surface of the glass core.

In the present embodiment, when forming a wiring pattern on the second surface of the glass core, a metal wiring pattern is formed, connecting between the ends of the TGV-embedded wiring pattern protruded from the second surface, while also forming a metal film in the grooves where the glass core has been transformed by laser beam irradiation and etched away as mentioned above. By forming a metal film at the outer peripheral portion, breakage is prevented from occurring from the side faces of the truncated square pyramid of the glass core. If the metal wiring pattern is formed only on the first and second surfaces of the glass core, breakage is likely to occur from the side faces of the truncated square pyramid of the glass core due to tensile stress induced by self-annealing or due to expansion and contraction caused by reflow heat treatment when mounting the device. However, such disadvantages can be eliminated by the present embodiment.

By forming a metal adhesion-enhancing layer by sputtering or electroless plating on the outer peripheral portion of the glass core and by covering the layer with an electrolytic plating to increase the thickness, the occurrence of breakage is prevented or minimized. The metal adhesion-enhancing layer is preferred to be provided by forming a film of Ti, Ni, Cu or the like for use as a seed layer for electrolytic plating. The electrolytic plating bath is preferred to be an electrolytic copper plating bath from the perspective of improving working efficiency for simultaneously forming a wiring pattern on the second surface, with films on the side faces of the truncated square pyramid of the glass core.

In the present embodiment, it is preferred that, in each of the glass core devices cut out with a desired size, the second surface and the side faces of the truncated square pyramid of the glass core are coated with a resin, ceramic or the like to provide an outer protective layer. The outer protective layer covers and protects a total of five surfaces, including the second surface and the side faces of the truncated square pyramid of the glass core. Portions of the embedded outer protective layer are diced along the center of each groove that has been formed in the glass core by transforming a portion of the glass core by femtosecond laser beam irradiation and removing the transformed portion with hydrofluoric acid, to finally cut out glass core devices. The cut out glass core devices each have a rectangular parallelopiped shape without exposing the glass core.

It should be noted that a buildup resin may be laminated (an insulating resin lamination layer may be formed) on the first or second surface of the glass core, followed by forming vias and a wiring layer. These processes may be repeated to provide a multilayer wiring pattern. Alternatively, the glass core device may be incorporated with a passive component by forming a capacitor, in which a high dielectric material is embedded, in the device or by forming a resistor in the device. Alternatively, the glass core device may be incorporated with an inductor by forming a coiled wiring pattern in the device.

REFERENCE SIGNS LIST

10: Glass core; 10a: First surface; 10b: Second surface; 11: TGV; 12: Seed layer; 21: Photoresist; 22: Electrolytic copper plating; 31: Carrier substrate; 32: Adhesive; 33: Wiring pattern protective insulating resin; 41: Transformed glass portion; 61: Electrolytic copper plating; 62: Outer protective layer.

What is claimed is:

1. A glass core device, comprising:
    a flat glass core having a first surface and a second surface facing away from each other, the glass core consists of glass and through-glass holes extending between the first surface and the second surface,
    through-glass vias formed in the through-glass holes of the glass core, and,
    wiring patterns comprising a through-glass via wiring pattern embedded in the through-glass vias, and first and second wiring patterns provided respectively on the first surface and the second surface of the glass core, the first wiring patterns and the second wiring patterns are electrically connected via the through-glass via wiring pattern embedded in the through-glass vias,
    wherein the glass core device is provided with a protective resin continuously covering the second surface of the glass core and outermost side faces of the glass core, the protective resin includes no holes or openings, and
    wherein the wiring patterns further comprise a metal film covering (a) an outer peripheral portion of the first surface and the second surface of the glass core and (b) the side faces of the glass core, the metal film is further coated with the protective resin.

2. The glass core device of claim 1, wherein the glass core has a thickness of 20 μm or more and 800 μm or less.

3. The glass core device of claim 1, wherein the glass core has a surface roughness Ra of 20 nm or less.

4. The glass core device of claim 1, wherein the glass core has a truncated square pyramidal shape, with sides on the first surface parallel to the second surface being shorter than sides on the second surface.

5. The glass core device of claim 1, wherein portions of the through-glass via wiring pattern embedded in the through-glass vias protrude from the first surface of the glass core.

6. The glass core device of claim 1, wherein the through-glass holes are micro-diameter through holes.

7. A method of producing a glass core device, comprising the steps of:
    forming through holes in a glass core having a first surface and a second surface facing away from each other;
    forming through-glass vias by forming a first wiring pattern on the first surface of the glass core and in the through holes thereof, and sealing the first surface with an insulating resin;
    bonding a carrier substrate onto the first surface of the glass core;
    linearly irradiating the second surface of the glass core with a laser beam to ablate portions of the glass core;
    etching away the ablated by the laser beam portions of the glass core by chemical treatment to form grooves for dicing the glass core;
    forming a second wiring pattern on the second surface of the glass core, filling the grooves with a protective resin, and sealing the second surface with the protective resin; and,
    cutting the protective resin filled in the grooves and thereby, dicing the glass core, wherein the protective resin covers outermost side faces of the diced glass core, the insulating resin sealing the first surface completely covers the first surface so that the insulating resin contains no holes or openings, wherein in the step of etching away the ablated portions of the glass core by chemical treatment to form grooves for dicing the glass core:
        exposed portions of the second surface of the glass core are also etched to reduce thickness of the glass core and protrude the wiring pattern in the through-glass vias from the second surface; and,
        the second wiring pattern formed on the second surface so as to be connected to portions of the first wiring pattern protruding from the through-glass vias.

* * * * *